United States Patent
Park

(10) Patent No.: US 9,269,618 B2
(45) Date of Patent: Feb. 23, 2016

(54) SEMICONDUCTOR DEVICE AND METHOD FOR MANUFACTURING THE SAME

(71) Applicant: SK hynix Inc., Icheon (KR)

(72) Inventor: Hyung Jin Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/539,906

(22) Filed: Nov. 12, 2014

(65) Prior Publication Data

US 2015/0072513 A1 Mar. 12, 2015

Related U.S. Application Data

(62) Division of application No. 13/717,590, filed on Dec. 17, 2012, now abandoned.

(30) Foreign Application Priority Data

Aug. 28, 2012 (KR) ........................ 10-2012-0094223

(51) Int. Cl.
  *H01L 21/768* (2006.01)
  *H01L 21/321* (2006.01)
  *H01L 21/3205* (2006.01)
  *H01L 21/02* (2006.01)
  *H01L 21/311* (2006.01)
  *H01L 29/423* (2006.01)
  *H01L 27/08* (2006.01)
  *H01L 49/02* (2006.01)
  *H01L 27/108* (2006.01)

(52) U.S. Cl.
  CPC .... *H01L 21/76877* (2013.01); *H01L 21/02282* (2013.01); *H01L 21/31111* (2013.01); *H01L 21/32055* (2013.01); *H01L 21/32115* (2013.01); *H01L 21/76852* (2013.01); *H01L 21/76897* (2013.01); *H01L 27/08* (2013.01); *H01L 27/10855* (2013.01); *H01L 27/10888* (2013.01); *H01L 28/40* (2013.01); *H01L 29/4236* (2013.01); *H01L 27/10885* (2013.01); *H01L 28/90* (2013.01)

(58) Field of Classification Search
  CPC ................... H01L 21/02282; H01L 21/31111; H01L 21/32055; H01L 21/32115; H01L 21/76852; H01L 21/76877; H01L 21/76897; H01L 27/08; H01L 27/10855; H01L 27/10885; H01L 27/10888; H01L 28/90; H01L 28/40
  See application file for complete search history.

(56) References Cited

U.S. PATENT DOCUMENTS

| | | | |
|---|---|---|---|
| 2007/0173057 A1* | 7/2007 | Lee et al. | 438/640 |
| 2011/0165747 A1* | 7/2011 | Kim | 438/270 |
| 2012/0012912 A1* | 1/2012 | Kwon | 257/302 |

FOREIGN PATENT DOCUMENTS

| | | |
|---|---|---|
| KR | 10-2000-0045339 A | 7/2000 |
| KR | 10-2005-0063150 A | 6/2005 |

* cited by examiner

*Primary Examiner* — Whitney T Moore

(57) ABSTRACT

A semiconductor device comprises a bit line formed over a semiconductor substrate. The bit line has an upper portion and a lower portion, and the upper portion is narrower than the lower portion. An barrier film is formed over sidewalls of the bit line, and a storage node contact plug is obtained by filling a space between the bit lines so that an upper portion of the storage node contact is wider than a lower portion of the storage node contact. As a result, the process can be simplified and a short between the storage node contact plug and the bit line can be prevented.

8 Claims, 5 Drawing Sheets

SEMICONDUCTOR DEVICE AND METHOD FOR MANUFACTURING THE SAME

CROSS-REFERENCE TO RELATED APPLICATION

The present application is a divisional of U.S. patent application Ser. No. 13/717,590, filed Dec. 17, 2012, which claims priority to Korean Patent Application No. 10-2012-0094223 filed Aug. 28, 2012, which are incorporated by reference in their entirety.

BACKGROUND OF THE INVENTION

1. Technical Field

The present invention relates generally to a semiconductor device and a method for manufacturing the same, and more particularly to a technology for simplifying the process of manufacturing a semiconductor device and preventing a short between a storage node contact plug and a bit line.

2. Related Art

Semiconductor devices include a plurality of unit cells including a capacitor and a transistor. The capacitor is used to store data and the transistor is used to transfer data between the capacitor and a bit line in response to a control signal (a word line) using a semiconductor property in which electric conductivity changes according to conditions. The transistor has three parts: a gate, a source, and a drain. Charges move between the source and drain in response to the control signal input to the gate. The charges move between the source and drain through a channel region using semiconductor properties.

When a conventional transistor is fabricated on a semiconductor substrate, the gate is formed over the semiconductor substrate and then the source and drain are formed by implanting impurities into the semiconductor substrate. In this case, the area between the source and drain below the gate becomes the channel region of the transistor. A transistor having such a horizontal channel region occupies a given area of the semiconductor substrate. In complicated semiconductor memory devices, it is difficult to reduce overall size because a plurality of transistors are included in each semiconductor memory device.

However, if the size of the semiconductor memory device is reduced, the number of semiconductor memory devices that can be produced per wafer can be increased, thereby improving productivity. In order to reduce the size of the semiconductor memory device, various methods have been suggested. For example, instead of a conventional planar gate having a horizontal channel region, a recess gate may be used. A recess is formed in the semiconductor substrate, and a gate is formed in the recess so that a channel region may be formed along a curved surface of the recess.

A buried gate, obtained by burying the entire gate within the recess, has also been studied. In a semiconductor device including a buried gate, after the semiconductor substrate is etched to a given depth to form a trench, a gate electrode is buried in the trench, and then a bit line is formed over the semiconductor substrate. A storage node contact plug connected to the semiconductor substrate is formed at both sides of the bit line, and a storage electrode connected to the storage node contact plug may also be formed.

During the process for forming the storage electrode region, a hard mask layer disposed over the bit line may be lost, which results in weak electrical characteristics between two cells. In order to prevent this shortcoming, a process for forming an additional storage node contact plug coupled to the initial storage node contact plug has been suggested. However, the additional processes necessary for forming the double storage electrode contact plugs may increase production costs.

Moreover, such a structure may cause contact resistance to increase. In order to lower the interface resistance between the polysilicon layer disposed over the storage node contact plug and a TiN layer that comprises the lower contact of the storage electrode, a titanium layer is stacked after the storage electrode region is formed. As a result, an additional process for forming a titanium silicide ($Ti_xSi$) is required, thus narrowing the size of the lower portion of the storage electrode region and reducing a margin of the subsequent process.

BRIEF SUMMARY OF THE INVENTION

Various embodiments of the present invention are directed to providing a semiconductor device including a storage electrode coupled to a storage node contact plug having an expanded upper portion, thereby simplifying manufacturing. Also, embodiments of the present invention are directed to providing an barrier film formed over sidewalls of the storage node contact plug, such that it is unnecessary to form a titanium silicide layer to secure an interface resistance characteristic between the storage electrode and the storage node contact plug, thereby simplifying the process.

According to an embodiment of the present invention, a semiconductor device comprises: a multi-width bit line formed over a semiconductor substrate, the multi-width bit line having a lower portion with a first width that is greater than a second width which is a width of an upper portion; an barrier film formed over sidewalls of the bit line; and a storage node contact plug with an upper portion corresponding to the upper portion of the multi-width bit line and a lower portion corresponding to the lower portion of the multi-width bit line, wherein a width of the upper portion of the storage node contact plug is greater than a width of the lower portion of the storage node contact plug, and the upper portion of the storage node contact plug and the lower portion of the storage node contact plug comprise a single material.

The semiconductor device further may comprise a buried gate buried within the semiconductor substrate.

The sidewalls of the multi-width bit line may have a step defining a difference between the first width and the second width.

The barrier film may include titanium nitride (TiN).

The storage node contact plug may include a polysilicon.

A portion of the barrier film may stop an etching process used to form a storage electrode over the lower portion of the storage node contact plug.

According to another embodiment of the present invention, a method for manufacturing a semiconductor device may comprise: forming a multi-width bit line having a lower portion with a width greater than a width of an upper portion over a semiconductor substrate; forming an barrier film over sidewalls of the multi-width bit line; and forming a storage node contact plug by filling a gap between neighboring multi-width bit lines, the storage node contact plug having a lower portion with a width that is greater than a width of the upper portion.

Before forming a multi-width bit line, the method further may comprise forming a buried gate within the semiconductor substrate.

The step of forming a multi-width bit line may include: forming a bit line over the semiconductor substrate with vertical sidewalls; forming an insulating film over the semiconductor substrate and sidewalls and an upper surface of the bit line; and performing a partial etch-back process on the insulating film.

The insulating film may include a spin-on-carbon (SOC) film.

A thickness of the insulating film formed over an lower sidewall of the bit line may be greater than a thickness of the insulating film formed over an upper sidewall of the bit line.

The step of the performing a partial etch-back process may include: etching the insulating film; and etching the upper sidewall of the bit line exposed by etching the insulating film without completely removing the insulating film formed over the lower portion of the bit line.

The sidewall of the multi-width bit line includes a step defining the difference between the width of the upper portion of the multi-width bit line and the width of the lower portion of the multi-width bit line.

The barrier film may include titanium nitride (TiN).

The step of forming a storage electrode contact plug may include: burying a polysilicon in a gap between the multi-width bit lines; and performing a planarizing etch process on the polysilicon to expose an upper surface of the multi-width bit line.

The step of performing a planarizing etch process may include removing a portion of the barrier film formed over an upper surface of the multi-width bit line.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1:
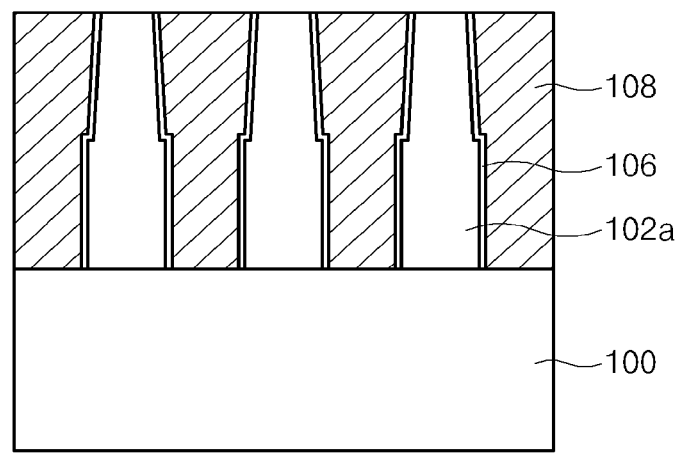
FIG. 1 illustrates a cross-sectional view of a semiconductor device according to an embodiment of the present invention.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments of the present invention should not be construed as being limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements.

FIG. 1 illustrates a cross-sectional view of a semiconductor device according to an embodiment of the present invention.

Referring to FIG. 1, the semiconductor device includes a multi-width bit line 102a formed over a semiconductor substrate 100. The multi-width bit line 102a has an expanded lower portion rather than an expanded upper portion. That is, the width of the lower portion of the multi-width bit line 102a is wider than the width of the upper portion of the multi-width bit line 102a.

The semiconductor device of FIG. 1 also includes an barrier film 106 formed over sidewalls of the multi-width bit line 102a. A storage node contact plug 108 is obtained by filling a space between the multi-width bit lines 102a. As a result, the storage node contact plug 108 has an expanded upper portion expanded rather than an expanded lower portion. In other words, the width of a lower portion of the storage node contact plug 108 is narrower than the width of an upper portion of the storage node contact plug 108. In an embodiment, a stepped portion may be formed in the sidewalls of the multi-width bit line 102a to create the width difference between the upper portion and the lower portion of the multi-width bit line 102a and the storage node contact plug 108.

Although not shown in the drawing, the semiconductor device of FIG. 1 may further comprise a buried gate formed within the semiconductor substrate 100. The barrier film 106 may include a TiN, and the storage node contact plug 108 may include a polysilicon.

As mentioned above, since the bit line has an expanded lower portion rather than an expanded upper portion, the width of the upper portion the storage node contact plug is formed to be relatively larger than the lower portion. As a result, a storage electrode may be coupled to the storage node contact plug having the expanded upper portion, thereby preventing a short between the storage electrode and the bit line.

Furthermore, since the barrier film 106, which is coupled to the semiconductor substrate 100, is formed over sidewalls of the storage node contact plug 108, it is not necessary to perform a titanium silicide process to reduce the resistance of an interface between the storage node contact plug. Also, the present invention can simplify the process because a titanium stacking process accompanied to perform the titanium silicide process and an additional cleaning process performed to remove a titanium stacked in an unnecessary part during the titanium stacking process are not required.

Hereinafter, a method for manufacturing the above-described semiconductor device will be described.

FIGS. 2a to 2f illustrate a method for manufacturing a semiconductor device according to an embodiment of the present invention.

Figure 2A:
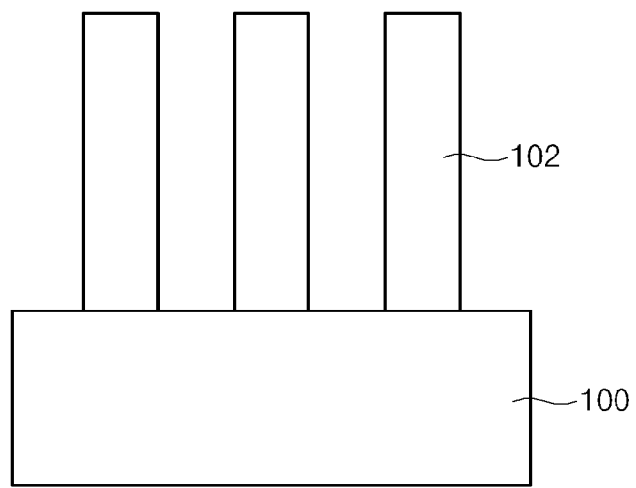
FIGS. 2a to 2f illustrate a method for manufacturing a semiconductor device according to an embodiment of the present invention.

Referring to FIG. 2a, a bit line 102 is formed over the semiconductor substrate 100. Although not shown, a spacer is formed over sidewalls of the bit line 102.

Figure 2B:
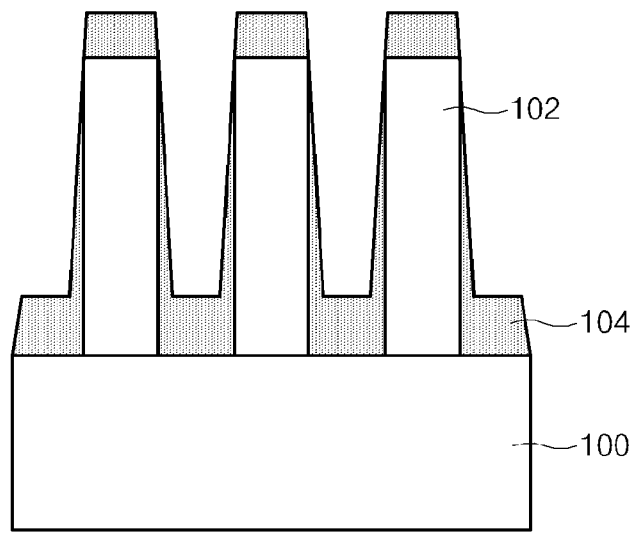

Referring to FIG. 2b, an insulating film 104 is formed over the semiconductor substrate 100 and the bit line 102. The insulating film 104 may include a spin on carbon (SOC) film. In an embodiment, portions of the insulating film 104 is formed over the sidewalls of the bit line 102 have a lesser thickness than portions of the insulating film 104 formed over the upper surface of the bit line 102 and semiconductor substrate 100. The SOC film may be used for the insulating film because of its poor step coverage, which results in a larger thickness over upper surfaces of the semiconductor substrate than over sidewalls of the bit line 102.

Figure 2C:
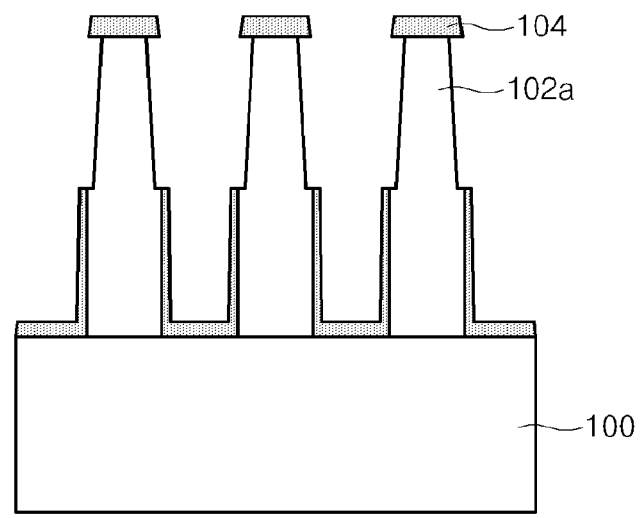

Referring to FIG. 2c, an etch-back process is performed on the insulating film 104. The extent of etching in the etch-back process may correspond to the thickness of the insulating film 104 remaining over the bit line 102. Thus, in an embodiment, a partial etch-back process may be performed to remove an upper portion of the insulating film 104 that has the least thickness over the sidewalls of the bit line 102.

In an embodiment, the etch-back process etches through an upper portion of the insulating film 104 with a lower thickness while a lower portion of the insulating film 104 with a greater thickness remains over lower portions of sidewalls of the bit line 102. Thus, the etch-back process may be terminated while portions of the insulating film remain over lower sidewalls of the multi-width bit line 102a, over lower surfaces of the storage contact node area, and over upper surfaces of the bit line 102, as shown in FIG. 2c. Thus, the etch-back process used to create the steps may be referred to as a partial etch-back process.

Although not shown, a hard mask layer or a spacer of the bit line 102 may be further etched, thereby obtaining the multi-width bit line 102a having a lower portion that is wider than an upper portion. In the resulting structure, the sidewalls of the multi-width bit line 102a may include a stepped portion such that there is a width difference between the upper portion and the lower portion of the bit line 102.

Figure 2D:
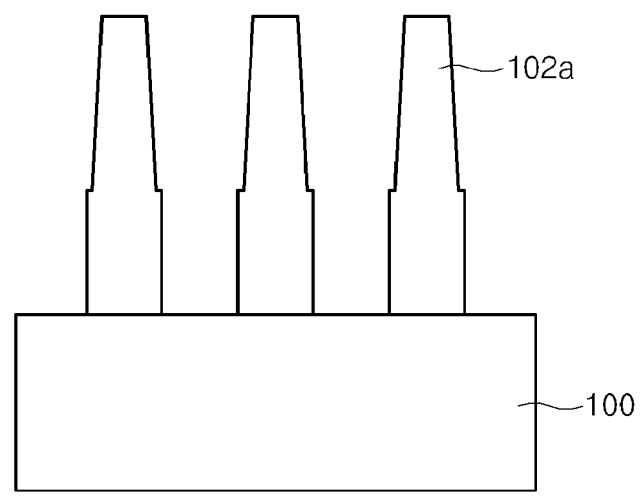

Referring to FIG. 2d, portions of the insulating film 104 remaining between the multi-width bit lines 102a and over lower sidewalls and upper surfaces of multi-width bit line 102a are removed. The insulating film 104 may be removed by a strip process.

Figure 2E:
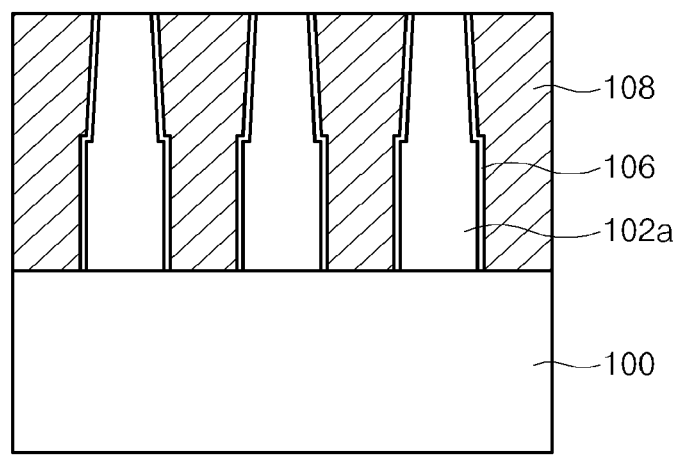

Referring to FIG. 2e, the barrier film 106 is formed over the semiconductor substrate 100 including sidewalls of multi-width bit line 102a. The barrier film 106 may include TiN. After a polysilicon is formed to fill the gap between the multi-width bit lines 102a, a planarizing etch process is performed to expose the upper surface of the multi-width bit line 102a, thereby obtaining the storage node contact plug 108. In other words, the planarizing etch process that removes upper portions of the storage node contact plug material may also remove portions of the barrier film 106 disposed over upper surfaces of multi-width bit lines 102a. In an embodiment, upper and lower portions of the storage node contact plug are formed at the same time in the same step using the same material to form a single homogenous structure.

Figure 2F:
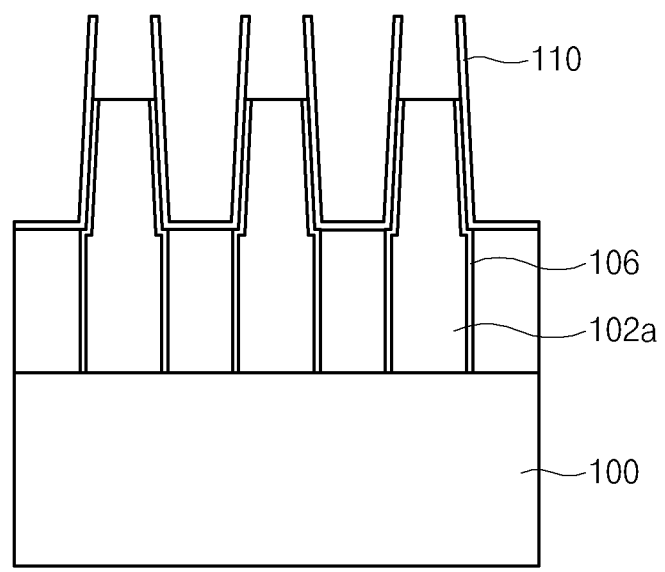

Thus, in accordance with an embodiment of the present invention, the width of the upper portion of the storage node contact plug 108 is larger than that the width of the lower portion as a result of a profile of the multi-width bit line 102a. In a subsequent process, as shown in FIG. 2f, a storage electrode 110 is formed over a lower portion of the storage node contact plug 108. An upper portion of contact plug 108 is etched to form a storage electrode contact hole (not shown). When forming the storage electrode 110, the barrier film 106 formed over the step in the sidewall of the multi-width bit line 102a may act as an etch barrier when etching the hole in which the storage electrode is formed. In addition, as seen in FIG. 2f, the step may define a lower corner of storage electrode 110. In other words, a portion of the barrier film stops an etching process used to form a storage electrode 110 over the lower portion of the storage node contact plug 108. Such a configuration may prevent a short that would otherwise occur between the storage electrode and the bit line using a two-part storage node contact structure.

In an embodiment of the present invention, it may not be necessary to perform a titanium silicide process to reduce resistance between storage node contact plugs because the barrier film 106 is formed over sidewalls of the storage node contact plug 108. Moreover, embodiments of the present invention can simplify a manufacturing process because a titanium stacking process and a titanium silicide process. Also, an additional cleaning process performed to remove titanium, which may be deposited in an unnecessary part during the titanium stacking process are not required.

Accordingly, the present invention provides a configuration of a storage node contact plug having an expanded upper portion, thereby reducing the number of process steps compared to a the process for forming a storage node contact plug with two layers. Also, due to the barrier film formed over the sidewalls of the storage node contact plug, a titanium silicide process is not necessary to lower resistance in an interface between the storage electrode and the storage node contact plug, further simplifying the process.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device, the method comprising:
    forming a multi-width bit line having a lower portion with a width greater than a width of an upper portion over a semiconductor substrate;
    forming a barrier film over sidewalls of the multi-width bit line; and
    forming a storage node contact plug by filling a gap between neighboring multi-width bit lines, the storage node contact plug having an upper portion with a width that is greater than a width of a lower portion,
    wherein the step of forming a multi-width bit line includes:
        forming a bit line over the semiconductor substrate with vertical sidewalls;
        forming an insulating film over the semiconductor substrate and sidewalls and an upper surface of the bit line; and
        performing a partial etch-back process on the insulating film to form the multi-width bit line,
    wherein a thickness of the insulating film formed over a sidewall of a lower portion of the bit line is greater than a thickness of the insulating film formed over a sidewall of an upper portion of the bit line, the lower portion being closer to the semiconductor substrate than the upper portion.

2. The method according to claim 1, further comprising, before forming a multi-width bit line, forming a buried gate within the semiconductor substrate.

3. The method according to claim 1, wherein the insulating film includes a spin-on-carbon (SOC) film.

4. The method according to claim 1, wherein the step of performing a partial etch-back process includes:
    etching the insulating film; and
    etching the sidewall of the upper portion of the bit line exposed by etching the insulating film without completely removing the insulating film formed over the lower portion of the bit line.

5. The method according to claim 1, wherein the sidewall of the multi-width bit line includes a step defining a difference between the width of the upper portion of the multi-width bit line and the width of the lower portion of the multi-width bit line.

6. The method according to claim 1, wherein the barrier film includes titanium nitride (TiN).

7. The method according to claim 1, wherein the step of forming a storage electrode contact plug includes:
    burying polysilicon in a gap between the multi-width bit lines; and
    performing a planarizing etch process on the polysilicon to expose an upper surface of the multi-width bit line.

8. The method according to claim 7, wherein the step of performing a planarizing etch process includes removing a portion of the barrier film formed over an upper surface of the multi-width bit line.

* * * * *